United States Patent [19]

Hickernell et al.

[11] Patent Number: 5,047,363
[45] Date of Patent: Sep. 10, 1991

[54] METHOD AND APPARATUS FOR REDUCING HETEROSTRUCTURE ACOUSTIC CHARGE TRANSPORT DEVICE SAW DRIVE POWER REQUIREMENTS

[75] Inventors: Fred S. Hickernell, Phoenix; Frederick Cho, Scottsdale; Frederick M. Fliegel, Tempe, all of Ariz.

[73] Assignee: Motorola, Inc., Schaumburg, Ill.

[21] Appl. No.: 618,207

[22] Filed: Nov. 26, 1990

Related U.S. Application Data

[62] Division of Ser. No. 577,180, Sep. 4, 1990.

[51] Int. Cl.[5] .................... H01L 21/70; H01L 21/18
[52] U.S. Cl. .................................. 437/53; 29/25.35; 310/313 R; 357/24
[58] Field of Search ............... 29/25.35; 357/24, 26; 437/7, 53

[56] References Cited

U.S. PATENT DOCUMENTS

| | | | |
|---|---|---|---|
| 4,137,141 | 1/1979 | Henry et al. | 204/192.3 |
| 4,884,001 | 11/1989 | Sacke et al. | 29/25.35 |
| 4,893,161 | 1/1990 | Tanski et al. | 357/24 |
| 4,994,772 | 2/1991 | Ballato | 310/313 R |

OTHER PUBLICATIONS

Tanski et al., Heterojunction Acoustic Charge Transport Devices on GaAs, Oct. 26, 1987, pp. 18-20.

*Primary Examiner*—Olik Chaudhuri
*Assistant Examiner*—Steven A. Katz
*Attorney, Agent, or Firm*—Frank J. Bogacz

[57] ABSTRACT

A HACT device employing a thin-film overlay of a more strongly piezoelectric material can operate as a delay line and as a tapped delay line, or transversal filter, while requiring less total power for the SAW clock signal. The increased electrical potential per unit total SAW power thus realized facilitates coupling between the total SAW energy and the mobile charge carriers. Some materials systems, such as a GaAs substrate and a ZnO thin-film overlay, will require an intervening thin-film dielectric layer in between the HACT substrate and epitaxial layers and the thin-film piezoelectric overlay. This may be necessitated by chemical, semiconductor device processing, or adhesion incompatibilities between the substrate material and the thin-film overlay material.

5 Claims, 1 Drawing Sheet

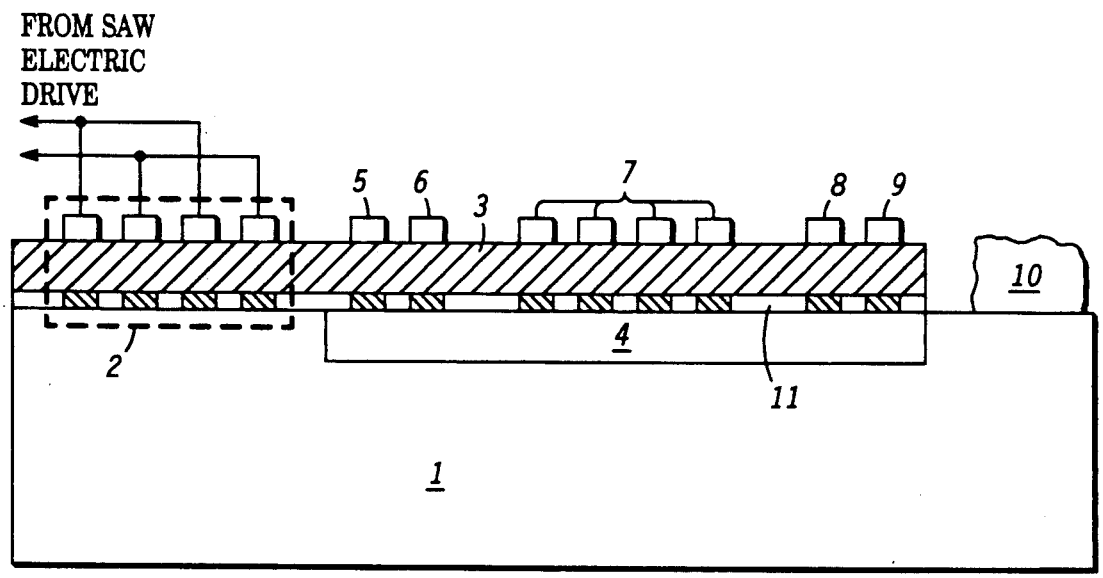
FIG. 1
FIG. 2
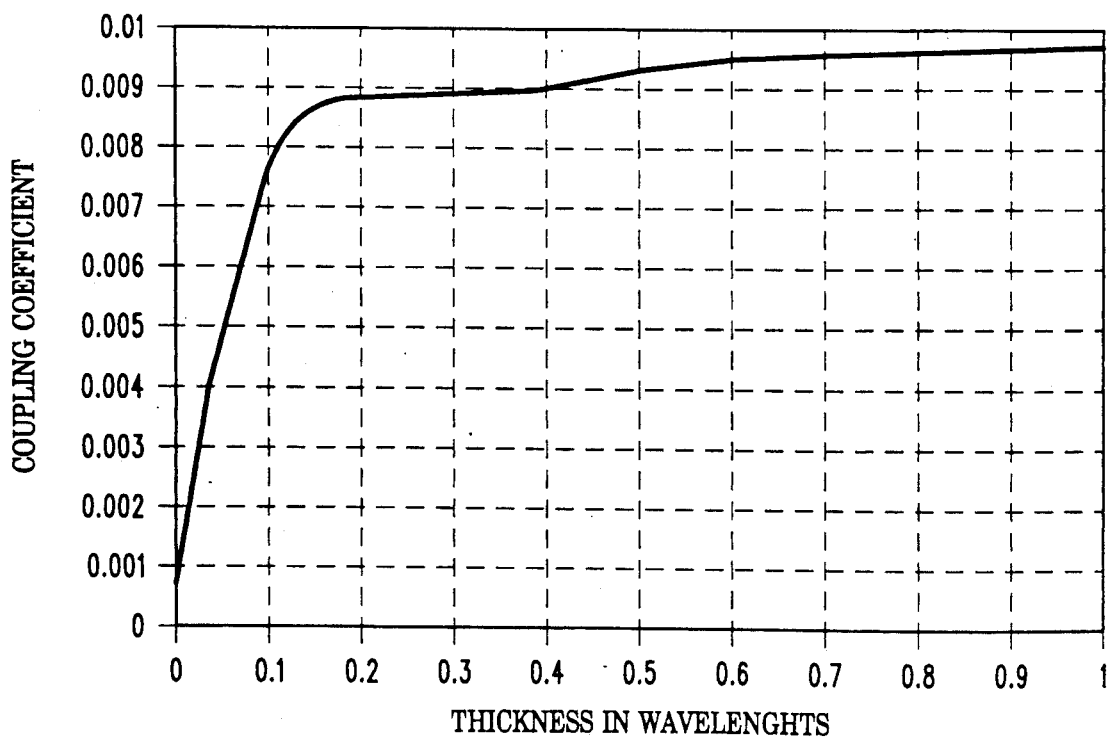

METHOD AND APPARATUS FOR REDUCING HETEROSTRUCTURE ACOUSTIC CHARGE TRANSPORT DEVICE SAW DRIVE POWER REQUIREMENTS

This is a division of application Ser. No. 577,180, filed Sept. 4,1990.

BACKGROUND OF THE INVENTION

The present invention pertains to a heterostructure acoustic charge transport (HACT) devices and more particularly to an arrangement for improving device performance by reducing the magnitude of the surface acoustic wave (SAW) required for effective HACT device operation.

An HACT device employs a powerful ultra high frequency (UHF) SAW propagating on the top, highly polished surface of a wafer of piezoelectric semiconductor material, usually gallium arsenide (GaAs), to bunch mobile charge carriers in the extrema of the SAW electrical potential and to then transport these discrete charge packets at the speed of sound through the semiconductor material, as is described in detail in U.S. Pat. No. 4,893,161, entitled "Quantum-Well Acoustic Charge Transport Device," issued to William J. Tanski, Sears W. Merritt, and Robert N. Sacks. The SAW thus functions similarly to the clocking signal in a conventional charge-coupled device (CCD), but without the need for the complex interconnections which CCD's require.

The very weak piezoelectricity of GaAs ($k^2 = 7.4 \times 10^{-4}$ for the Rayleigh mode on {100}-cut, <110>-propagating GaAs) dictated that the great majority of the energy in the SAW is manifested as mechanical energy and only a small portion of the total energy is manifested through the electrical potential which accompanies the SAW. It is this electrical component of the total SAW energy which bunches the charge carriers to form distinct packets and which transports these packets, representing the input signal, through the HACT device. Accordingly, present day ACT and HACT devices require large (about one Watt) acoustic power levels in order to realize the voltage required (about one Volt) to effect coherent charge packet transport within the HACT channel, synchronous with the SAW clock signal.

Therefore, it is an object of the present invention to provide an HACT device which includes a greatly reduced acoustic power requirement for achieving coherent, synchronous charge transport.

SUMMARY OF THE INVENTION

In accomplishing the object of the present invention, a novel HACT device structure employing a thin-film overlay of another material is shown.

A heterostructure acoustic charge transport device includes a semiconductor substrate which as a surface and a source of electrical charge. The semiconductor substrate also includes a surface acoustic wave device which is coupled to the semiconductor substrate. The surface acoustic wave device operates in response to the applied electrical charge source to transport electric charge.

The semiconductor substrate also includes a channel which is disposed along the surface of the semiconductor substrate. The channel transports the electric charge in a particular direction in response to the surface acoustic wave device. Lastly, the semiconductor substrate includes a piezoelectric layer which is disposed over the channel. The piezoelectric layer facilitates transportation of the electric charge in the particular direction.

The above and other objects, features, and advantages of the present invention will be better understood from the following detailed description taken in conjunction with the accompanying drawings.

BRIEF DESCRIPTION OF THE DRAWING

FIG. 1 is a longitudinal cross-sectional view of an HACT device employing a thin-film overlay of a dielectric and also another thin-film layer of material.

FIG. 2 is a graph of the electromechanical coupling coefficient versus ZnO layer thickness on a semi-insulating {100}-cut, <110>-propagating GaAs substrate.

DESCRIPTION OF THE PREFERRED EMBODIMENT

A HACT device employing a thin-film overlay of a more strongly piezoelectric material can operate as a delay line and as a tapped delay line, or transversal filter, while requiring less total power for the SAW clock signal. The increased electrical potential per unit total SAW power thus realized facilitates coupling between the total SAW energy and the mobile charge carriers. Some materials systems, such as a GaAs substrate and a ZnO thin-film overlay, will require an intervening thin-film dielectric layer in between the HACT substrate and epitaxial layers and the thin-film piezoelectric overlay. This may be necessitated by chemical, semiconductor device processing, or adhesion incompatibilities between the substrate material and the thin-film overlay material.

In acoustic charge transport (ACT), and in HACT technology, charge transport occurs in piezoelectric semiconductors (for example, {100}-cut, <110>-propagating GaAs) when mobile charge is injected into, and trapped within the extrema of, the propagating electrical potential which is associated with a SAW. Referring to FIG. 1, the semiconductor substrate 1 has incorporated upon it an interdigital metallic SAW transducer pattern 2 for generating the SAW in response to an applied external voltage at the appropriate frequency. The SAW transduction is enhanced by means of an appropriate thin-film overlay 3 of a piezoelectric material, such as zinc oxide (ZnO), as discussed in "GaAs Monolithic SAW Devices for Signal Processing and Frequency Control," by T. W. Grudkowski, G. K. Montress, M. Gilden, and J. F. Black, IEEE Catalogue No. 80CH1602-2, pages 88-97, aluminum nitride (AlN), as discussed in "Growth and Properties of Piezoelectric and Ferroelectric Films," by M. H. Francome and S. V. Krishnaswamy, in Journal of Vacuum Science and Technology A 8(3), pages 1382-1390, or lithium niobate (LiNbO$_3$) or other ferroelectric material, as discussed in the above and in "Metalorganic Chemical Vapor Deposition of PbTiO$_3$ Thin Films," by B. S. Kwak, E. P. Boyd, and A. Erbil, in Applied Physics Letters, 53(18), pages 1702-1704. The travelling-wave electrical potential associated with the SAW is also enhanced by this overlay layer 3. The SAW then propagates from left to right, for example, encountering the edge of the epitaxial layers comprising the channel 4, sweeping past the input contact 5, where charge is injected into the minima of the SAW electrical potential and entrained. The amount of the charge which is injected into any particular minimum of the travelling-wave electrical potential associated with the SAW is determined by the magnitude of the input signal which is impressed upon the input contact 5 at the time that the SAW electrical potential minimum passes by the input contact 5, and this particular charge packet magnitude remains invariant as the charge packet thus formed moves through the HACT channel 4 in that particular electrical potential minimum at the speed of sound. The input electrode bias is formed by impressing a voltage difference between the input ohmic contact 5 and the input Schottky gate 6. The charge packets then move beneath the nondestructive sensing (NDS) Schottky electrode array 7, where the charge capacitively couples to the NDS electrodes 7 and forms image charges which are a replica of the channel charge and hence of the charge representing the input signal. The image charges induced in these NDS electrodes 7 are combined to form a transversal filter from which an output signal is derived. The charge packets are then swept to the delay line output contact 9, where a delayed replica of the input signal is extracted by application of a suitable bias voltage applied between the delay line output Schottky gate contact 8 and the delay line output contact 9. Finally, the SAW energy is incident upon an acoustic absorber 10 which consists of a mass of a suitable viscous material, such as a room temperature vulcanizing silicone rubber (RTV), to avoid unwanted effects which can result from reflection of the SAW energy by the substrate 1 edges.

In the conventional HACT or ACT device, the very small ($k^2 = 7.4 \times 10^{-4}$), SAW electromechanical coupling coefficient dictates that the bulk of the energy in the SAW is available only as mechanical energy, rather than as electrical potential. As such, large amounts of acoustic power must be transduced by the SAW transducer 2 in order to have available the voltage level required in order to effect the bunching of charge carriers, such as electrons, and the subsequent transport of the charge bunches, or packets, synchronously with the SAW, as is required for manifestation of the ACT phenomenon. The power level required in order to achieve a given electrical potential is directly related to the total acoustic power level present through the electromechanical coupling coefficient, $k^2$.

As such, incorporation of a more strongly piezoelectric overlayer 3, providing greater electromechanical coupling between the SAW and the attendant electrical potential, results in reduced total acoustic power requirements to achieve a given electrical potential magnitude and so effect the HACT phenomenon. The degree of change in acoustic power requirements which can be effected is illustrated by the graph given in FIG. 2, for the case of Rayleigh waves propagating in the <110> direction on a {100}-cut GaAs substrate 1, versus the thickness (in acoustic wavelengths) of a more strongly piezoelectric ZnO overlayer 3. As can be seen in FIG. 1, very thin layers 3 of ZnO result in dramatic improvements in the electromechanical coupling coefficient magnitude, to about a thickness of 0.15 wavelengths. For thicker ZnO overlayers 3, as can be seen in FIG. 1, the increase in electromechanical coupling is seen to saturate at a value of about $k^2 0.01$. In the more general case, the ratio of the acoustic powers required to achieve the same electrical potential in different substrates 1 and overlayers 3 is given by:

$$P_{a,x}/P_{a,y} = (k_x^2 C_{sx} V_{ox})/(K_y^2 C_{s,y} V_{oy})$$

where the acoustic power for the material X is denoted $P_{a,x}$, with a similar convention applying to the other substrate parameters being compared; $k_x^2$ refers to the electromechanical coupling coefficient; $C_{sx}$ refers to the characteristic capacitance per finger pair per cm., and $v_{ox}$ refers to the SAW velocity for that substrate 1 or composite materials system.

For the particular case of a thin-film ZnO layer 3 in FIG. 1 on a GaAs substrate 1, ranging from less than one to several micrometers in thickness, several different issues dictate the inclusion of a thin-film dielectric layer 11, intervening between the ZnO layer 3 and the GaAs substrate 1.

These issues devolve from the poor adhesion which ZnO exhibits on GaAs substrates 1, evidenced by observed delamination of the thin-film layers 3, the excellent adhesion which ZnO layers 3 exhibit on $Si_3N_4$ dielectric layers 11, the excellent adhesion of $Si_3N_4$ layers 11 to GaAs substrates 1, the electronic effects which zinc (a rapid diffusant and a p-type dopant) and oxygen (a deep trap, removing carriers from the material and re-emitting them at random times with very long time constants) exhibit when incorporated into the GaAs substrate 1 material, and the deleterious effects of ion bombardment of the GaAs substrate 1 material during the sputtering process utilized for deposition and growth of ZnO films 3, which is obviated by the inclusion of an intervening layer 11 of dielectric material.

The inclusion of a thin film layer of a more piezoelectric material 3 on a semiconductor substrate 1 which includes an HACT device thus results in substantial reduction of the acoustic energy level required in order to manifest the HACT phenomenon. Further, some combinations of thin-film overlay 3 and substrate 1 materials will dictate the incorporation of a thin-film dielectric layer 11.

When the thin-film piezoelectric layer 3 is also included over the SAW transducer 2, a reduced area on the semiconductor substrate is required. This occurs through well-known relationships between SAW transducer parameters and results in greater SAW transducer 2 operating bandwidth. This increased bandwidth allows for greater variation in the SAW frequency. This can be used to compensate for SAW transducer frequency shifts introduced by temperature or manufacturing variations. The reduced SAW transducer size allows for an increased number of HACT devices per wafer and so for reduced cost per device.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A method for increasing the charge carrying capacity of a heterostructure acoustic charge transport device, comprising the steps of:

providing a semiconductor substrate having a surface;

fabricating an interdigital metallic surface acoustic wave transducer along said surface of said semiconductor substrate;

providing a channel including epitaxial layers of semiconductor material along said surface of said semiconductor substrate;

depositing a thin-film layer of piezoelectric material along said channel of said semiconductor substrate said thin-layer of dielectric material being more strongly dielectric than said semiconductor substrate;

providing electric charge to said channel of said substrate; and transporting said electric charge through said channel.

2. A method for increasing the charge carrying capacity for a heterostructure acoustic charge transport device as claimed in claim 1, wherein there is further included the step of interposing a thin-film dielectric layer between said channel and said piezoelectric thin-film layer, said thin-film dielectric layer for promoting adhesion-of said piezoelectric thin-film layer to said channel.

3. A method for increasing the charge carrying capacity of a heterostructure acoustic charge transport device as claimed in claim 1, wherein there is further included the step of attaching an acoustic absorber means attached to said surface of said semiconductor substrate to prevent reflection of said surface acoustic wave.

4. A method for increasing the charge carrying capacity of a heterostructure acoustic charge transport device as claimed in claim 1, wherein there is further included the steps of:

providing an input ohmic contact for coupling said electric charge to said channel;

providing an input Schottky contact for controlling the transportation of said electric charge through said channel, providing a Schottky nondestructive sensing electrode array coupled to said channel for monitoring said transported electric charge;

providing an output Schottky contact for controlling the flow of electric charge through said channel; and providing an output contact for receiving a replica of said input electric charge.

5. A method for reducing drive power requirements of a SAW transducer in a heterostructure acoustic charge transport device, comprising the steps of:

providing a semiconductor substrate having a surface;

fabricating an interdigital metallic surface acoustic wave transducer along said surface of said semiconductor substrate;

providing a channel including epitaxial layers of semiconductor material along said surface of said semiconductor substrate;

depositing a thin-film layer of piezoelectric material along said channel of said semiconductor substrate;

providing electric charge to said channel of said substrate; and transporting said electric charge through said channel with approximately 50 milliWatts of power applied to said surface wave transducer.

* * * * *